(12) United States Patent
Shi (10) Patent No.: US 11,139,267 B2
(45) Date of Patent: Oct. 5, 2021

(54) PACKAGING STRUCTURE AND FORMING METHOD THEREOF

(71) Applicant: TONGFU MICROELECTRONICS CO., LTD., Nantong (CN)

(72) Inventor: Lei Shi, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 69 days.

(21) Appl. No.: 16/393,139

(22) Filed: Apr. 24, 2019

(65) Prior Publication Data

US 2020/0027857 A1 Jan. 23, 2020

(30) Foreign Application Priority Data

Jul. 19, 2018 (CN) .......................... 201810796545.6

(51) Int. Cl.
*H01L 21/56* (2006.01)
*H01L 23/00* (2006.01)
*H01L 21/78* (2006.01)

(52) U.S. Cl.
CPC ............ *H01L 24/96* (2013.01); *H01L 21/561* (2013.01); *H01L 21/565* (2013.01); *H01L 21/568* (2013.01); *H01L 21/78* (2013.01); *H01L 24/05* (2013.01); *H01L 24/13* (2013.01); *H01L 2224/024* (2013.01); *H01L 2224/0239* (2013.01); *H01L 2224/13024* (2013.01); *H01L 2224/13111* (2013.01); *H01L 2224/13139* (2013.01); *H01L 2224/13144* (2013.01); *H01L 2224/13147* (2013.01); *H01L 2224/95001* (2013.01); *H01L 2924/014* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01079* (2013.01); *H01L 2924/067* (2013.01); *H01L 2924/0695* (2013.01); *H01L 2924/07025* (2013.01)

(58) Field of Classification Search
CPC ..... H01L 24/96; H01L 21/561; H01L 21/565; H01L 21/568; H01L 21/78; H01L 24/05; H01L 24/13; H01L 2224/0239; H01L 2224/024; H01L 2224/13144; H01L 2924/014; H01L 24/20; H01L 24/19
See application file for complete search history.

(56) References Cited

U.S. PATENT DOCUMENTS

2009/0039523 A1* 2/2009 Jiang ................... H01L 21/82
257/777
2010/0084763 A1* 4/2010 Yu ........................ H01L 24/05
257/737

(Continued)

*Primary Examiner* — Charles D Garber
*Assistant Examiner* — S M Sohel Imtiaz
(74) *Attorney, Agent, or Firm* — Anova Law Group, LLC (57) ABSTRACT

Packaging structure and method of forming a packaging structure are provided. A substrate is provided, and an adhesive layer is formed on the substrate. An improvement layer is formed on the adhesive layer. The improvement layer contains openings exposing surface portions of the adhesive layer at bottoms of the openings. A plurality of chips is provided and includes functional surfaces. The plurality of chips is mounted on the substrate such that the functional surfaces are bonded to the adhesive layer at the bottoms of the openings.

14 Claims, 5 Drawing Sheets

(56) References Cited

U.S. PATENT DOCUMENTS

| | | | |
|---|---|---|---|
| 2013/0292849 A1* | 11/2013 | Lin | H01L 25/0652 |
| | | | 257/774 |
| 2017/0110421 A1* | 4/2017 | Liu | H01L 24/19 |
| 2018/0047772 A1* | 2/2018 | Wang | H01L 27/14636 |
| 2018/0068977 A1* | 3/2018 | Wang | H01L 24/24 |
| 2018/0130749 A1* | 5/2018 | Tsai | H01L 21/4853 |
| 2018/0182917 A1* | 6/2018 | Kuramoto | H01L 24/20 |
| 2019/0103375 A1* | 4/2019 | Huang | H01L 21/4857 |
| 2019/0148288 A1* | 5/2019 | Tsou | H01L 23/5384 |
| | | | 257/738 |

\* cited by examiner

PACKAGING STRUCTURE AND FORMING METHOD THEREOF

CROSS-REFERENCES TO RELATED APPLICATIONS

This application claims priority of Chinese Patent Application No. 201810796545.6, filed on Jul. 19, 2018, the entire content of which is hereby incorporated by reference.

FIELD OF THE INVENTION

The present disclosure generally relates to the field of packaging and, more particularly, relates to packaging structures and forming methods thereof.

BACKGROUND

With rapid development of integrated circuit manufacturing industry, requirements for packaging technologies of integrated circuits are increasing. Existing packaging technologies mainly include ball grid array packaging (BGA), chip-size packaging (CSP), wafer-level packaging (WLP), three-dimensional packaging (3D), and system in package (SiP). Among them, the wafer-level packaging (WLP) is gradually adopted by most semiconductor manufacturers due to its advantages. All or most of processing steps of the wafer-level packaging (WLP) may be completed on a silicon wafer whose pre-processes have been completed, and finally the wafer is directly cut into independent devices.

The wafer-level packaging has the following advantages. The wafer-level packaging may have a high packaging efficiency. Multiple wafers may be processed at a same time. The wafer-level packaging may have advantages of flip-chip packaging. That is, packaging structures formed by the wafer-level packaging may be light, thin, short, and small. Compared with previous processing steps, the wafer-level packaging only adds two processing steps including pin rewiring (RDL) and bump making, and all other processing steps are conventional processing steps. Further, the wafer-level packaging may reduce multiple tests in conventional packaging. Accordingly, major IC packaging companies in the world invested in the research, development and production of the wafer-level packaging.

However, many problems of existing wafer-level packaging technologies still need to be solved, and performances of packaging structures formed by existing wafer-level packaging technologies may be still undesirable. The disclosed methods and structures are directed to solve one or more problems set forth above and other problems in the art.

BRIEF SUMMARY OF THE DISCLOSURE

One aspect of the present disclosure includes a method of forming a packaging structure. A substrate is provided, and an adhesive layer is formed on the substrate. An improvement layer is formed on the adhesive layer. The improvement layer contains openings exposing surface portions of the adhesive layer at bottoms of the openings. A plurality of chips is provided and includes functional surfaces. The plurality of chips is mounted on the substrate such that the functional surfaces are bonded to the adhesive layer at the bottoms of the openings.

Another aspect of the present disclosure includes a packaging structure. The packaging structure includes a substrate, an adhesive layer formed on the substrate, and an improvement layer formed on the adhesive layer. The improvement layer has openings exposing surface portions of the adhesive layer at bottoms of the openings. The packaging structure also includes chips located in the openings. The chips include functional surfaces that adhere to the adhesive layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

Figure 1:
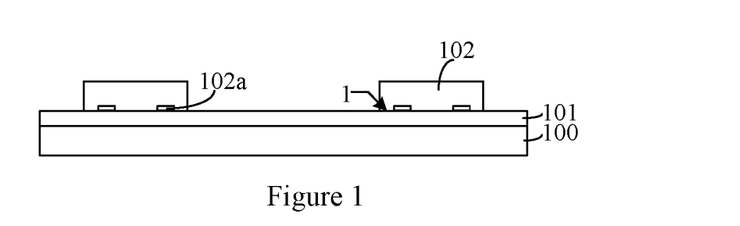
FIG. 1 illustrates a packaging structure.

Performances of packaging structures formed by existing wafer-level packaging technologies may be undesirable. FIG. 1 illustrates a packaging structure. As shown in FIG. 1, a substrate 100 is provided, and an adhesive layer 101 is disposed on a surface of the substrate 100. Chips 102 are provided, and each of the chips 102 includes a functional surface 1. Each of the chips 102 has pads 102a at the functional surface 1. Each of the chips 102 is mounted on the substrate 100 through the adhesive layer 101 such that the functional surface 1 is bonded to the adhesive layer 101.

In the packaging structure shown in FIG. 1, a material of the chips 102 includes silicon that has a small thermal expansion coefficient. A thermal expansion coefficient of a material of the adhesive layer 101 is much larger than a thermal expansion coefficient of the material of the chips 102. Accordingly, in a subsequent high temperature process, degrees of thermal expansions of the adhesive layer 101 and the chips 102 may be different. Thus relative displacements between the chips 102 and the adhesive layer 101 may occur, resulting in poor performances of the packaging structure.

To solve the above technical problems, the present disclosure provides a forming method of a packaging structure. In the forming method, a plurality of separated improvement layers is formed on top of the adhesive layer, and openings located between adjacent improvement layers may define chip positions. Thus, chip offsets may be prevented and performances of the packaging structure may be improved.

Figure 2:
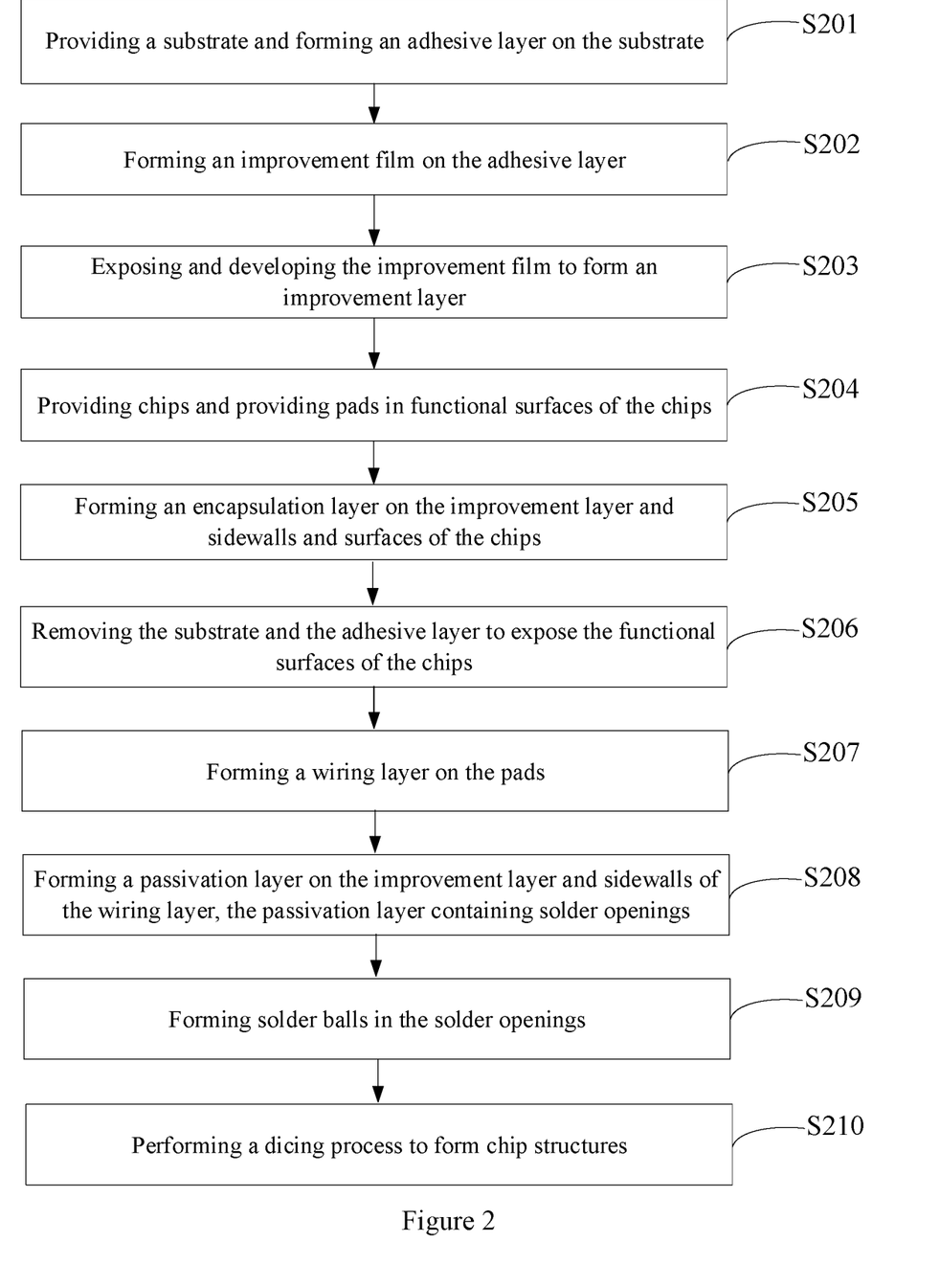
FIG. 2 illustrates an exemplary process of forming a packaging structure consistent with the disclosed embodiments.

FIG. 2 illustrates an exemplary process of forming a packaging structure consistent with the disclosed embodiments; and FIGS. 3 to 12 illustrate structures corresponding to certain stages of an exemplary process of forming a packaging structure consistent with the disclosed embodiments.

Figure 3:
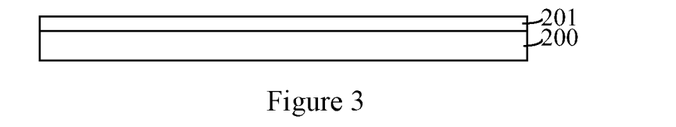
FIGS. 3 to 12 illustrate structures corresponding to certain stages of the exemplary process of forming a packaging structure consistent with the disclosed embodiments.

As shown in FIG. 2, at the beginning of the forming process, a substrate is provided, and an adhesive layer is disposed on the substrate (S201). FIG. 3 illustrates a corresponding structure.

As shown in FIG. 3, a substrate 200 is provided, and an adhesive layer 201 is disposed on a surface the substrate 200. A material of the substrate 200 includes glass, ceramic, metal, or polymer. A shape of the substrate 200 includes a circle, a rectangle, or a triangle. The adhesive layer 201 may make subsequent chips adhere to the surface of the substrate 200.

In one embodiment, a material of the adhesive layer 201 is an ultraviolet adhesive. The ultraviolet adhesive may have a high viscosity when it is not irradiated by ultraviolet light. Cross-linking chemical bonds in the ultraviolet adhesive may be broken after being irradiated by ultraviolet light, and the viscosity of the ultraviolet adhesive may thus decrease or disappear. Accordingly, the adhesive layer 201 and the substrate 200 may be peeled off in a subsequent process.

In some other embodiments, the material of the adhesive layer may include an acrylic pressure sensitive adhesive or an epoxy pressure sensitive adhesive.

A forming process of the adhesive layer 201 includes a spin coating process, a spray coating process, a rolling process, a printing process, a non-rotating coating process, a hot pressing process, a vacuum pressing process, or a pressure pressing process.

The material of the adhesive layer 201 has a first thermal expansion coefficient, and the first thermal expansion coefficient may be high.

Figure 4:
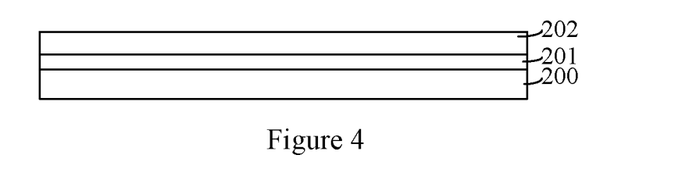

Returning to FIG. 2, after providing the substrate and disposing the adhesive layer, an improvement film may be disposed on the adhesive layer (S202). FIG. 4 illustrates a corresponding structure.

As shown in FIG. 4, an improvement film 202 is disposed on a surface of the adhesive layer 201. A material of the improvement film 202 includes a photoresist, and a forming process of the improvement film 202 includes a printing process or a spin coating process. The improvement film 202 may be used to subsequently form an improvement layer.

The improvement film 202 has a second thermal expansion coefficient, and the second thermal expansion coefficient may be high. The difference between the second thermal expansion coefficient and the first thermal expansion coefficient falls within a preset range. Specifically, the preset range may be approximately −50 to 50. Accordingly, relative displacements between the improvement layer 202 and the adhesion layer 201 may not easily occur during subsequent high temperature processes. Further, subsequent openings in the improvement layer may limit displacements of chips. Accordingly, deflection or warpage of the packaging structure may be reduced.

Figure 5:
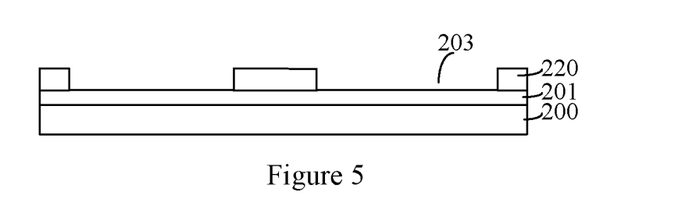

Returning to FIG. 2, after the improvement film is disposed on the adhesive layer, the improvement film may be exposed and developed to form an improvement layer (S203). FIG. 5 illustrates a corresponding structure.

Referring to FIG. 5, the improvement film 202 (see FIG. 4) is exposed and developed to form an improvement layer 220, and openings 203 are disposed in the improvement layer 220. Since the improvement layer 220 is formed from the improvement film 202, the improvement layer 220 has the second thermal expansion coefficient. The difference between the second thermal expansion coefficient and the first thermal expansion coefficient falls within the preset range. Accordingly, in subsequent high temperature processes, relative displacements between the improvement layer 220 and the adhesion layer 201 may not easily occur. Moreover, since the openings 203 may limit positions of subsequent chips, relative positions between the chips and the improvement layer 220 may not change. As such, relative displacements between the chips, the improvement layer 220 and the adhesion layer 201 may not easily occur, and thus the deflection or warpage of the packaging structure may be reduced.

A depth of the openings 203 is in a range of approximately 10 micrometers to 50 micrometers. If the depth of the openings 203 is less than approximately 10 micrometers, the depth of the openings 203 may be too shallow. The openings 203 in the improvement layer 220 may have a weak ability in limiting subsequent chips, and thus the chips may still be prone to offset during subsequent process. If the depth of the openings 203 is greater than approximately 50 micrometers, a process of forming the openings 203 may be difficult.

Figure 6:
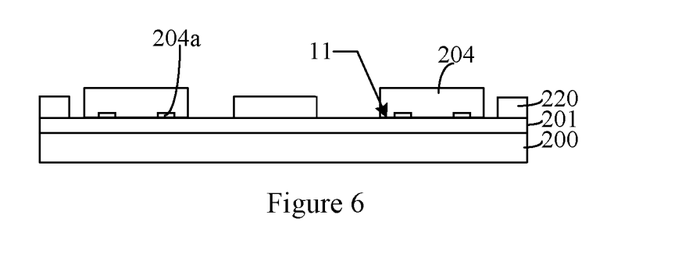

Returning to FIG. 2, after the improvement layer is formed, chips 204 may be provided (S204). FIG. 6 illustrates a corresponding structure.

As shown in FIG. 6, chips 204 are provided. Each of the chips 204 includes a functional surface 11, and pads 204a are disposed in the functional surface 11. Each of the chips 204 is mounted on the substrate 200 such that the functional surface 11 is bonded to the adhesive layer 201 at a bottom of the opening 203 (see FIG. 5).

A material of the chips 204 includes silicon, and the chips 204 have a thermal expansion coefficient in a range of approximately 2.2 to 2.4. The pads 204a may be used to output electrical signals in the chips 204. A thickness of the chips 204 is in a range of approximately 20 micrometers to 100 micrometers. The chips 204 are mounted on the substrate 200 through the adhesive layer 201.

In one embodiment, a surface of the chip 204 is higher than a surface of the improvement layer 220, and thus a portion of the chip 204 is located in the opening 203. The improvement layer 220 at the sidewall of the opening 203 may limit the position of the chip 204, preventing relative displacement between the chip 204 and the improvement layer 220 and the adhesive layer 201. Thus the deflection or warpage of the packaging structure may be reduced.

Figure 7:
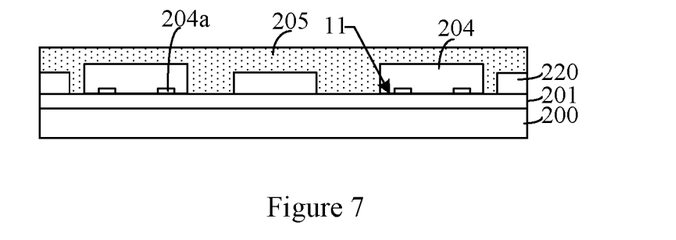

Returning to FIG. 2, after the chips 204 are provided, an encapsulation layer may be formed on the improvement layer and sidewalls and surfaces of the chips (S205). FIG. 7 illustrates a corresponding structure.

As shown in FIG. 7, an encapsulation layer 205 is formed on a surface of the improvement layer 220 and sidewalls and surfaces of the chips 204. The encapsulation layer 205 may protect the chips 204, and may be a carrier of subsequent processes.

In one embodiment, a material of the encapsulation layer 205 is epoxy resin. The epoxy resin has good encapsulation performances and may be easily molded, and thus the epoxy resin may be a preferred material for forming the encapsulation layer 205.

In some other embodiments, the material of the encapsulation layer may be an encapsulation material. The encapsulation material includes polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, and polyvinyl alcohol.

In one embodiment, a forming process of the encapsulation layer 205 includes an injection molding process. In some other embodiments, the forming process of the encapsulation layer may include a transfer molding process or a screen printing process.

The injection molding process for forming the encapsulation layer 205 includes providing a mold and filling the mold with an encapsulation material, wherein the encapsulation material covers the chips 204. The injection molding process also includes heating and curing the encapsulation material to form the encapsulation layer 205.

In the structure shown in FIG. 7, difference between the thermal expansion coefficient of the material of the chip 204 and the thermal expansion coefficients of the improvement layer 220 and the adhesive layer 201 may be large. But, in the process of forming the encapsulation layer 205, since a portion of the chip 204 is located in the opening 203, the opening 203 may limit the relative displacement between the chip 204 and the improvement layer 220 and adhesion layer 201 during the heating and curing process. Moreover, the difference between the thermal expansion coefficients of the improvement layer 220 and the adhesive layer 201 falls within the predetermined range. Thus the relative displacement between the improvement layer 220 and the adhesive layer 201 may not easily occur during the temperature-raising curing process. As such, the relative displacements between the chip 204, the improvement layer 220 and the adhesive layer 201 may not easily occur, and the offset or warpage of the packaging structure may thus be reduced.

In one embodiment, after the encapsulation layer 205 is formed, the encapsulation layer 205 is not subjected to a thinning treatment. In some other embodiments, after the encapsulation c seal layer is formed, the encapsulation layer may be subjected to a thinning treatment until surfaces of the chips are exposed.

Figure 8:
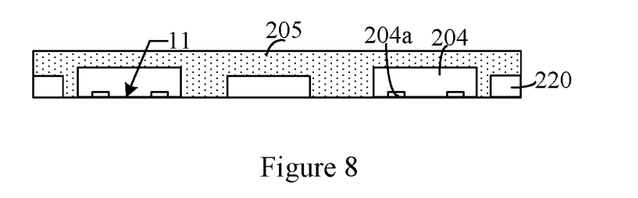

Returning to FIG. 2, after the encapsulation layer is formed, the substrate and the adhesive layer may be removed to expose the functional surfaces of the chips (S206). FIG. 8 illustrates a corresponding structure.

As shown in FIG. 8, after the encapsulation layer 205 is formed, the substrate 200 (see FIG. 7) and the adhesive layer 201 (see FIG. 7) are removed to expose the functional surfaces 11 of the chips 204.

In one embodiment, a material of the adhesive layer 201 is an ultraviolet adhesive. A process of removing the substrate 200 (see FIG. 7) and the adhesive layer 201 (see FIG. 7) includes irradiation with ultraviolet light. Due to the irradiation with ultraviolet light, adhesiveness of the adhesive layer 201 may decrease, and thus the adhesive layer 201 and the substrate 200 may be peeled off.

The functional surfaces 11 of the chips 204 are exposed after the substrate 200 (see FIG. 7) and the adhesive layer 201 (see FIG. 7) are removed. Subsequently, a wiring layer may be formed on the functional surfaces 11, and soldering balls may be formed on a surface of the wiring layer. The wiring layer is electrically connected to the pads 204a.

Figure 9:
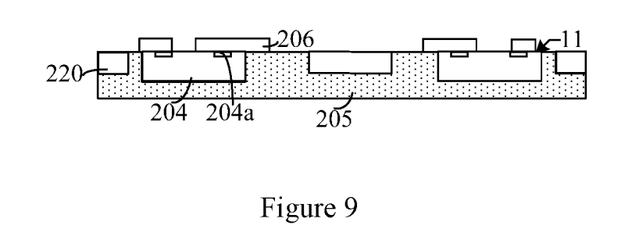

Returning to FIG. 2, after the substrate and the adhesive layer are removed, a wiring layer may be formed on the pads (S207). FIG. 9 illustrates a corresponding structure.

Referring to FIG. 9, after the substrate 200 and the adhesive layer 201 are removed, a wiring layer 206 is formed on surfaces of the pads 204a. A material of the wiring layer 206 may be a metal, such as aluminum, copper, tin, nickel, gold or silver. A forming process of the wiring layer 206 includes an evaporation process, a sputtering process, an electroplating process, or a chemical plating process.

A bottom of the wiring layer 206 is electrically connected to tops of the pads 204a, and a top of the wiring layer 206 is electrically connected to subsequent solder balls.

Figure 10:
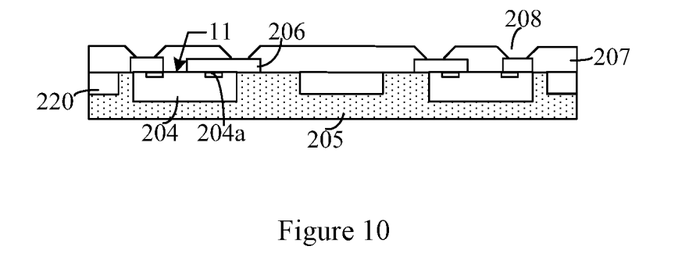

Returning to FIG. 2, after the wiring layer is formed on the surfaces of the pads, a passivation layer may be formed on the improvement layer and sidewalls of the wiring layer (S208). FIG. 10 illustrates a corresponding structure.

As shown in FIG. 10, a passivation layer 207 is formed on a surface of the improvement layer 220 and sidewalls of the wiring layer 206. The passivation layer 207 has solder openings 208 exposing a surface of the wiring layer 206.

A material of the passivation layer 207 includes polyimide, polyparaphenylene benzobisoxazole or photosensitive benzocyclobutene. A forming process of the passivation layer 207 includes a spin coating process or a printing process.

As the passivation layer 207 exposes a portion of the wiring layer 206, solder balls may be electrically connected to the wiring layer 206 in a subsequent process. The solder openings 208 may accommodate solder balls in a subsequent process.

Figure 11:
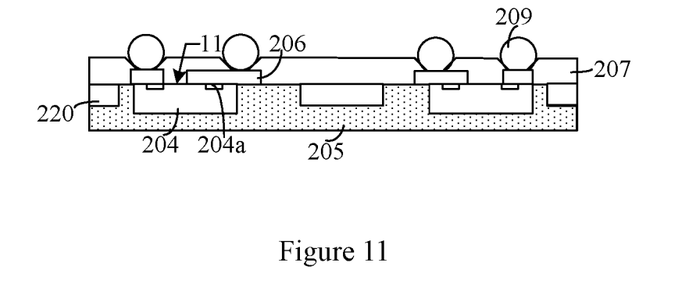

Returning to FIG. 2, after the passivation layer is formed, solder balls may be formed in the solder openings (S209). FIG. 11 illustrates a corresponding structure.

As shown in FIG. 11, solder balls 209 are formed in the solder openings 208 (see FIG. 10). The solder balls 209 include gold tin solder balls, silver-tin solder balls or copper-tin solder balls.

In one embodiment, the solder balls 209 are gold-tin solder balls. A process of forming the gold-tin solder balls includes forming a gold-tin layer in the solder openings 208. After the gold-tin layer is formed, a high temperature reflow process is performed to make the gold-tin layer reflow into a spherical shape, and the gold-tin solder balls are formed after temperature is decreased.

Figure 12:
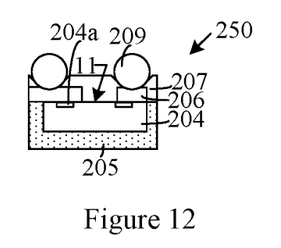

Returning to FIG. 2, after the solder balls are formed in the solder openings, a dicing process may be performed to form chip structures (S210). FIG. 12 illustrates a corresponding structure.

Referring to FIG. 12, after the solder balls 209 are formed, a dicing process is performed to form chip structures 250.

In one embodiment, the chip structures 250 do not include the improvement layer 220, and thus a subsequent process of removing the improvement layer 220 is not required. Accordingly, some processing steps may be omitted, and process complexity may thus be reduced.

In one embodiment, after the chip structures 250 are formed, the encapsulation layer 205 is not thinned. In some other embodiments, after the chip structures 250 are formed, the encapsulation layer is thinned until the surface of the chip is exposed.

Figure 13:
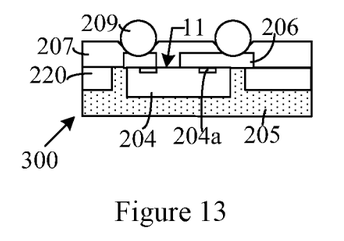
FIGS. 13 to 15 illustrate structures corresponding to certain stages of another exemplary process of forming a packaging structure consistent with the disclosed embodiments.
Figure 14:
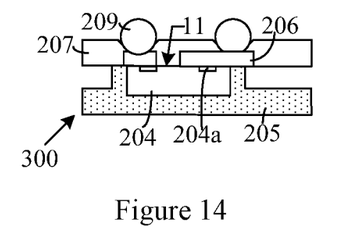
Figure 15:
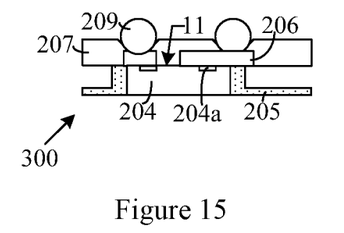

FIGS. 13 to 15 illustrate structures corresponding to certain stages of another exemplary forming process of a packaging structure.

Referring to FIG. 13, a dicing process is performed to form chip structures 300. It should be noted that the chip structure 300 shown in FIG. 13 is formed from the structure shown in FIG. 11. In one embodiment, the chip structure 300 includes a portion of the improvement layer 220.

Referring to FIG. 14, after the chip structures 300 are formed, the improvement layer 220 is removed. A process of removing the improvement layer 220 includes one or a combination of a dry etching process and a wet etching process.

Referring to FIG. 15, after the improvement layer 220 is removed, the encapsulation layer 205 is thinned until the surface of the chip 204 is exposed.

In one embodiment, after the improvement layer 220 is removed, the encapsulation layer 205 is thinned. In some other embodiments, after the improvement layer is removed, the encapsulation layer 205 is not thinned.

The present disclosure also provides a packaging structure. Referring to FIG. 6, the packaging structure includes a substrate 200, wherein an adhesive layer 201 is disposed on a surface of the substrate 200. The packaging structure also includes an improvement layer 220 disposed on a surface of the adhesive layer 201. The improvement layer 220 has openings 203 (see FIG. 5), and bottoms of the openings 203 expose the surface of the adhesive layer 201. The packaging structure also includes chips 204 located in the openings 203. The chips 204 includes functional surfaces 11 that adhere to the adhesive layer 201. Surfaces of the chips 204 are higher than a surface of the improvement layer 220. The adhesive layer 201 includes an ultraviolet adhesive, an acrylic pressure sensitive adhesive, or an epoxy pressure sensitive adhesive. A material of the improvement layer 220 includes a photoresist.

As disclosed, the technical solutions of the present disclosure have the following advantages.

In the process of forming a packaging structure provided by the technical solutions of the present invention, the improvement layer contains openings for subsequently receiving chips. Moreover, the improvement layer at sidewalls of the openings may prevent the chips from being offset. Accordingly, the process may improve performances of the packaging structure.

The embodiments disclosed herein are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit and scope of the invention, such other modifications, equivalents, or improvements to the disclosed embodiments are intended to be encompassed within the scope of the present disclosure.

What is claimed is:

1. A method of forming a packaging structure, comprising:
    providing a substrate;
    forming an adhesive layer on the substrate;
    forming an improvement layer on the adhesive layer, wherein the improvement layer contains openings there-in, exposing surface portions of the adhesive layer at bottoms of the openings;
    providing a plurality of chips, wherein the plurality of chips includes functional surfaces; and
    mounting the plurality of chips on the substrate such that the functional surfaces of the plurality of chips are bonded at the bottoms of the openings and in contact with the adhesive layer, and each chip is mounted within a corresponding opening of the openings.

2. The method according to claim 1, wherein the substrate is made of a material including glass, ceramic, metal, or polymer.

3. The method according to claim 1, wherein the plurality of chips within the openings in the improvement layer has a top surface higher than the improvement layer.

4. The method according to claim 3, wherein the plurality of chips has a thickness in a range of approximately 20 micrometers to 100 micrometers.

5. The method according to claim 3, wherein the openings have a depth in a range of approximately 10 micrometers to 50 micrometers.

6. The method according to claim 1, wherein the adhesive layer includes an ultraviolet adhesive, an acrylic pressure sensitive adhesive, or an epoxy pressure sensitive adhesive.

7. The method according to claim 1, wherein forming the improvement layer includes:
    forming an improvement film on the adhesive layer; and
    forming openings in the improvement layer by exposing and developing processes on the improvement film.

8. The method according to claim 1, wherein:
    after mounting the plurality of chips on the substrate, forming an encapsulation layer on the improvement layer and sidewalls and surfaces of the plurality of chips; and
    after forming the encapsulation layer, removing the substrate and the adhesive layer and thus exposing the functional surfaces of the plurality of chips.

9. The method according to claim 8, further comprising:
    after removing the substrate and the adhesive layer, forming a wiring layer on the functional surfaces and forming a passivation layer on a surface of the wiring layer, wherein the passivation layer has solder openings exposing a portion of the wiring layer;
    forming solder balls in the solder openings; and
    performing a dicing process, and thus forming chip structures.

10. The method according to claim 9, wherein:
    the chip structures do not include the improvement layer; or
    the chip structures include a portion of the improvement layer.

11. The method according to claim 9, wherein the wiring layer is made of a material including a metal, such as aluminum, copper, tin, nickel, gold or silver.

12. The method according to claim 9, wherein the passivation layer is made of a material including polyimide, polyparaphenylene benzobisoxazole or photosensitive benzocyclobutene.

13. The method according to claim 9, wherein the solder balls include gold tin solder balls, silver-tin solder balls or copper-tin solder balls.

14. The method according to claim 1, wherein the improvement layer at sidewalls of each opening confines a position of a corresponding chip within the opening.

* * * * *